(12) United States Patent
Parsons et al.

(10) Patent No.: US 8,808,145 B1
(45) Date of Patent: Aug. 19, 2014

(54) INTERACTIVE CLIMBING WALL SYSTEM USING TOUCH SENSITIVE, ILLUMINATING, CLIMBING HOLD BOLTS AND CONTROLLER

(71) Applicants: Chris Paul Parsons, Bellevue, WA (US); Ian Christoph Parsons, Bellevue, WA (US); Noah Hunter Parsons, Bellevue, WA (US)

(72) Inventors: Chris Paul Parsons, Bellevue, WA (US); Ian Christoph Parsons, Bellevue, WA (US); Noah Hunter Parsons, Bellevue, WA (US)

( * ) Notice: Subject to any disclaimer, the term of this patent is extended or adjusted under 35 U.S.C. 154(b) by 0 days.

(21) Appl. No.: 13/952,583

(22) Filed: Jul. 27, 2013

Related U.S. Application Data (60) Provisional application No. 61/684,207, filed on Aug. 17, 2012.

(51) Int. Cl.
*A63B 24/00* (2006.01)
*A63B 9/00* (2006.01)

(52) U.S. Cl.
USPC .................... 482/8; 482/23; 482/37; 273/441

(58) Field of Classification Search
USPC ............ 482/1–9, 23, 35, 37, 8; 273/440, 441; 434/247, 255; 463/36–47
See application file for complete search history.

(56) References Cited

U.S. PATENT DOCUMENTS

| | | | |
|---|---|---|---|
| 5,732,954 A * | 3/1998 | Strickler et al. | 273/441 |
| 8,668,626 B1 * | 3/2014 | Horowitz et al. | 482/37 |
| 2010/0004098 A1 * | 1/2010 | Hensley | 482/37 |

* cited by examiner

*Primary Examiner* — Glenn Richman (57) ABSTRACT

A system that uses touch sensitive, illuminating, climbing hold bolts connected to a network control unit to create an interactive environment featuring climbing hold illumination and the ability to detect a climber's presence on a hold. The system is connected to the internet where it is configured and enables users with a web enabled device to illuminate a route, or engage in a wide variety of interactive training activities and games.

3 Claims, 11 Drawing Sheets

INTERACTIVE CLIMBING WALL SYSTEM USING TOUCH SENSITIVE, ILLUMINATING, CLIMBING HOLD BOLTS AND CONTROLLER

CROSS-REFERENCE TO RELATED APPLICATIONS

This application claims the benefit of provisional patent application Ser. No. 61/684,207 filed 2012 Aug. 17 by the present inventor

FEDERALLY SPONSORED RESEARCH

None

SEQUENCE LISTING

None

BACKGROUND OF THE INVENTION

Indoor or "gym" climbing on artificial structures has evolved from the traditional outdoor sport of rock climbing where climbers ascend natural boulders and rock faces. The significant increase in the number of climbing gyms is largely attributed to their convenience, safety, and proximity to residential areas.

The walls at indoor climbing gyms are usually built from prefabricated fake-rock panels or textured plywood sheets that have regularly spaced holes and are attached to a metal or wood framework inside the gym. The walls are attached to the building's structure at both the base and the top so that they are stable and don't move or flex. While most gym walls are vertical, some walls have horizontal overhangs or sections that are other than 90° from the floor. Indoor climbing walls range in height from 10 to 50 feet.

Climbing holds are made of resin poured into molds of varying shapes and sizes from tiny edges to giant hand-sized buckets. The holds are bolted onto the wall's threaded holes using cap end hex bolts to provide support and/or a gripping place for the climber to ascend or traverse the wall.

With the holds attached to the wall, climbing gyms often hire designers to select a subset of the holds and collectively define this group as a 'route'. Routes are assigned a degree of difficulty from a scale of commonly understood and agreed upon subjective ratings. Climbers use route ratings to gauge their progress and compete against other climbers.

To designate a route, climbing gyms will use homogeneously colored holds, distinctly colored tape, or chalk marks. However, each of these methods has its drawbacks: buying same color holds for each route is prohibitively expensive, inflexible, and does not allow for overlapping routes; tape tends to peel off; and chalk is easily erased when climbers rub against the marks. Furthermore, each of these methods are static and require human interaction to set or alter a route's pattern.

Another issue with tradition indoor climbing routes is that when compared to other leisure activities, they can be boring. Without an interactive component, or game mechanic, climbers often tire of 'climbing plastic'. This problem is multiplied on home climbing walls that offer fewer routes for the climber to use. Moreover, the lack of interactivity does not allow the climber to improve their technique by providing feedback on their climbing.

DESCRIPTION OF PRIOR ART

U.S. Pat. No. 5,732,954, entitled "Route Recording, Marking, and Scoring Apparatus for Sport Climbing Walls", issued Mar. 31, 1998 to Strickler et al. teaches a system to record and identify routes created on artificial climbing structures. However, light source of '954 patent is completely separated and independent from the climbing holds and requires significant alteration of the climbing wall to install the system.

U.S. Pat. No. 5,732,954 A discloses a climbing wall comprising holds which detect the weight of a climber. Signals from weighted holds are transmitted to a computer which stores the route chosen by the climber. Electronically activated markers positioned adjacent to each hold then indicate the holds comprising this specific route. A new climber can try to follow this specific route by using indicated holds, but if the new climber uses an "illegal" hold which is not indicated, and thus is not included in the route, this is registered by the computer. However, this system requires specially designed holds and a customized, 'nonstandard', climbing wall.

U.S. Pat. Application 2008/0032863 discloses a climbing wall system comprising a climbing wall provided with several holds, each connected to a respective sensor which is arranged to detect the presence of a foot or a hand on the hold, where said system comprises a sound system arranged to play music, and a control device arranged to receive signals of the sensors and control the sound system to play a certain musical fragment when a particular hold is touched. While this system does provide an interactive indoor climbing component, it also requires gyms to purchase specialized climbing holds.

Applicant submits that there is no system found in the marketplace that allows climbing gyms to use their existing holds and climbing walls to create an interactive environment where climbing holds both illuminate, sense the climber's presence and enable the climber to participate in climber selectable activities. There is a need in the climbing art to provide an assembly and process to create planned climbing routes for indoor and outdoor climbing wall structures to keep climbers interested and challenged.

SUMMARY OF THE INVENTION

Whereas there is a long-felt and as yet unfulfilled need for a solution that enables climbing gyms to leverage their infrastructure investment with a system that uses existing climbing holds and climbing walls to create an interactive environment featuring climbing hold illumination and the ability to detect a climber's presence on a hold:

It is an object of the invention to provide an apparatus that uses the bolt that affixes a climbing hold to the wall as a mechanism to illuminate the hold.

Beyond using the bolt as a mechanism to illuminate the hold, it is a further object of the invention to provide an apparatus to detect a climber's presence on a hold through its mounting bolt.

It is a further object to provide an apparatus for recreational climbing that allows climbing routes to be selected and displayed on a climbing wall. The present invention, with its self-illumination property, can help climbers to identify their next hold in the route, the past route taken, a friend's route, etc.

It is a further object to provide an apparatus for competitive climbing that computes, displays, and stores a record of a climber's performance on a route.

It is a further object to provide an apparatus that increases the enjoyment of gym climbing through interactive exercises and games.

It is to be understood that both the foregoing general description and the following detailed description are exemplary and explanatory only and are not restrictive of the invention, as claimed.

The accompanying drawings, which are incorporated in and constitute a part of this specification, illustrate embodiments of the invention and together with the description, serve to explain the principles of the invention.

BRIEF DESCRIPTION OF THE DRAWINGS

A clear understanding of the key features of the invention summarized above may be had by reference to the appended drawings, which illustrate the method and system of the invention, although it will be understood that such drawings depict preferred embodiments of the invention and, therefore, are not to be considered as limiting its scope with regard to other embodiments which the invention is capable of contemplating. Accordingly.

DETAILED DESCRIPTION OF THE INVENTION

The description that follows is presented to enable one skilled in the art to make and use the present invention, and is provided in the context of a particular application and its requirements. Various modifications to the disclosed embodiments will be apparent to those skilled in the art, and the general principals discussed below may be applied to other embodiments and applications without departing from the scope and spirit of the invention. Therefore, the invention is not intended to be limited to the embodiments disclosed, but the invention is to be given the largest possible scope which is consistent with the principals and features described herein.

It will be understood that in the event parts of different embodiments have similar functions or uses, they may have been given similar or identical reference numerals and descriptions. It will be understood that such duplication of reference numerals is intended solely for efficiency and ease of understanding the present invention, and are not to be construed as limiting in any way, or as implying that the various embodiments themselves are identical.

Figure 1:
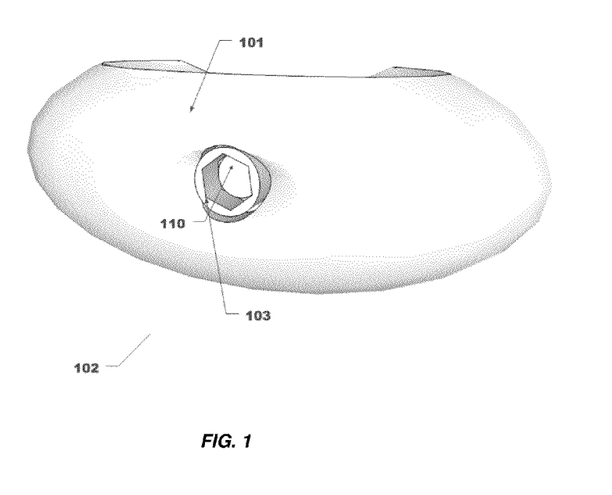
FIG. 1: is a representative front view of one embodiment of the touch sensitive, illuminating, climbing hold bolt affixing a hold to a climbing wall.

FIG. 1 is a representative front view of the touch sensitive, illuminating, climbing hold bolt (103) that is affixing a climbing hold (101) to a climbing wall (102). Hold installation does not dramatically change. However, instead of a standard bolt, our bolt is used to affix the hold to the wall. Construction materials of the bolt (103) must provide the required physical strength and properties, such that it performs the identical functions of a conventional climbing hold bolt.

Figure 2:
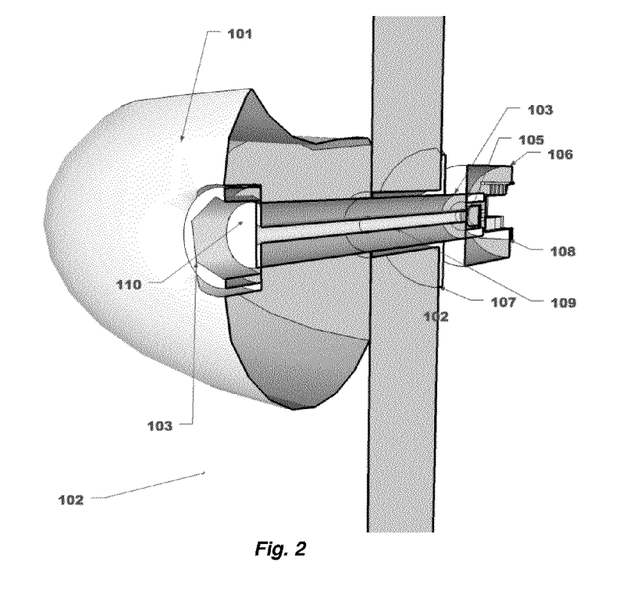
FIG. 2: is a representative cross-sectional view of one embodiment of the touch sensitive, illuminating, climbing hold bolt affixing a hold to a climbing wall.

FIG. 2 is a representative cross-sectional view of one embodiment of the bolt (103). As shown in FIG. 2, the bolt consists of a modified cap head bolt who's hexagonal cavity is partially filled with a light diffusing element (110) that terminates a bundled fiberoptic filament (109) that is routed longitudinally through the center of the bolt. By intersecting the fiberoptic filament, the translucent material (110) spreads the light across the bolt's hexagonal socket. At the posterior end of the bolt is a counterbored hole that has a main function to accommodate the LED light source (105).

Figure 3:
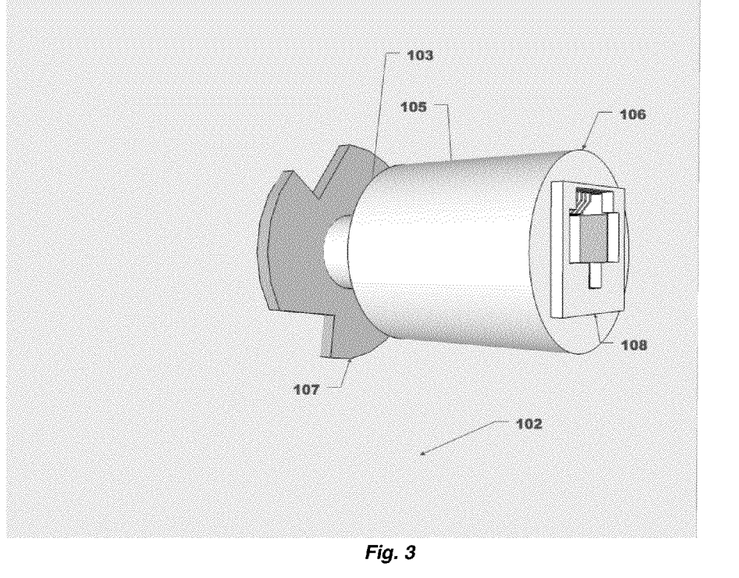
FIG. 3: is a representative back view of one embodiment of the light and sensor apparatus that is threaded onto the protruding end of the touch sensitive, illuminating, climbing hold bolt.

As shown in FIG. 3, once the climbing hold has been affixed to the wall with the bolt (103), a light/sensor unit (106) is threaded onto the posterior end of the bolt that is protruding from the backside of the wall (102). The light/sensor unit (106) has a female registered jack (RJ) (108) that it uses to interface with the control unit (FIG. 5).

Figure 4:
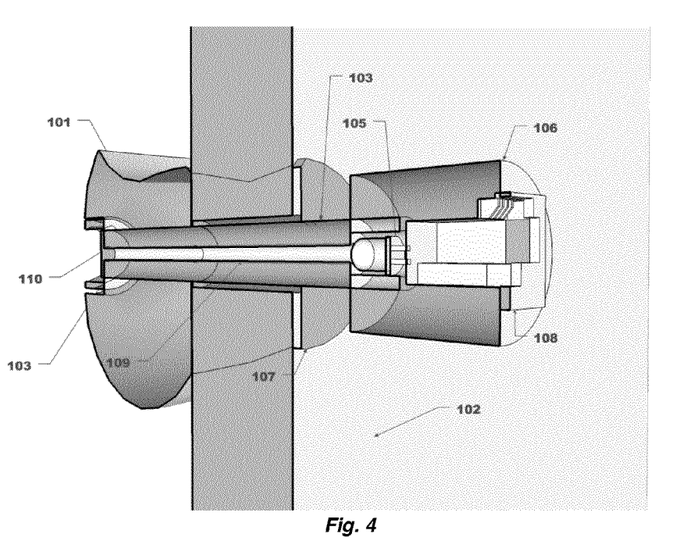
FIG. 4: is a representative cross-sectional view of one embodiment of the light and sensor apparatus that is threaded onto the protruding end of the touch sensitive, illuminating, climbing hold bolt.

FIG. 4 is a representative cross-sectional view of one embodiment of the light/sensor unit (106). This diagram depicts light/sensor unit (106) threaded onto posterior end of the bolt (103) and the RGB LED light source seated in the counterbored hole in the bolt.

In further detail, still referring to the invention of FIG. 4, the RGB LED light source emits light with enough intensity, such that the emitted light is conveyed through the fiberoptic filament (109) and diffused by the translucent material (110) at the cap end. Hence, making bolt (103) of the present invention visibly distinctive in light or dark environments. Each of the wires emanating from the LED (three anodes, one cathode) are connected to the RJ jack (108). The body of the light/sensor unit is also connected to the RJ jack to facilitate sensing a climber's presence through measuring a change in the bolt's capacitance.

Figure 5:
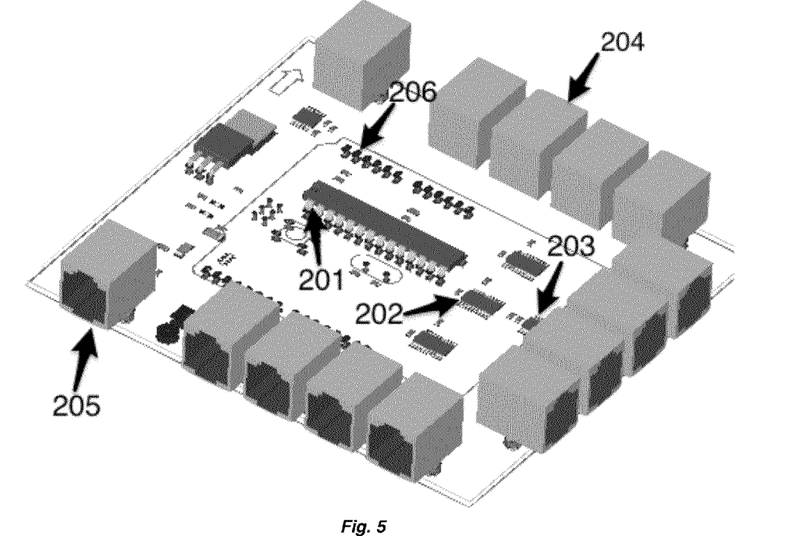
FIG. 5: is a representative diagram depicting a circuit board illustrative of the invention.

FIG. 5 is a representative diagram depicting a circuit board illustrative of the control unit that interacts with the light/sensor units. The control unit is connected to the light/sensor units through standard network cabling that is plugged into female registered jacks (RJ) on the device (204). The low voltage control apparatus is powered through a DC transformer connected household power supply. The unit is connected to a local area network through a wireless network adapter (205).

In more detail, still referring to the invention of FIG. 5, with each light/sensor unit containing three light elements (Red, Green, Blue), LED Display Drivers (202) are used by the microprocessor (201) to direct current to the appropriate element within a light/sensor unit. This approach provides flexibility by enabling the addition of light units by simply adding shift registers to the circuit board.

In further detail, still referring to the invention of FIG. 5, an integrated circuit (203) that measures changes in capacitance is also connected via the RJ jack (204) to each light/sensor unit to measure the presence of a climber. The control unit is connected to the internet through a wireless network adapter connected to headers (206).

Figure 6:
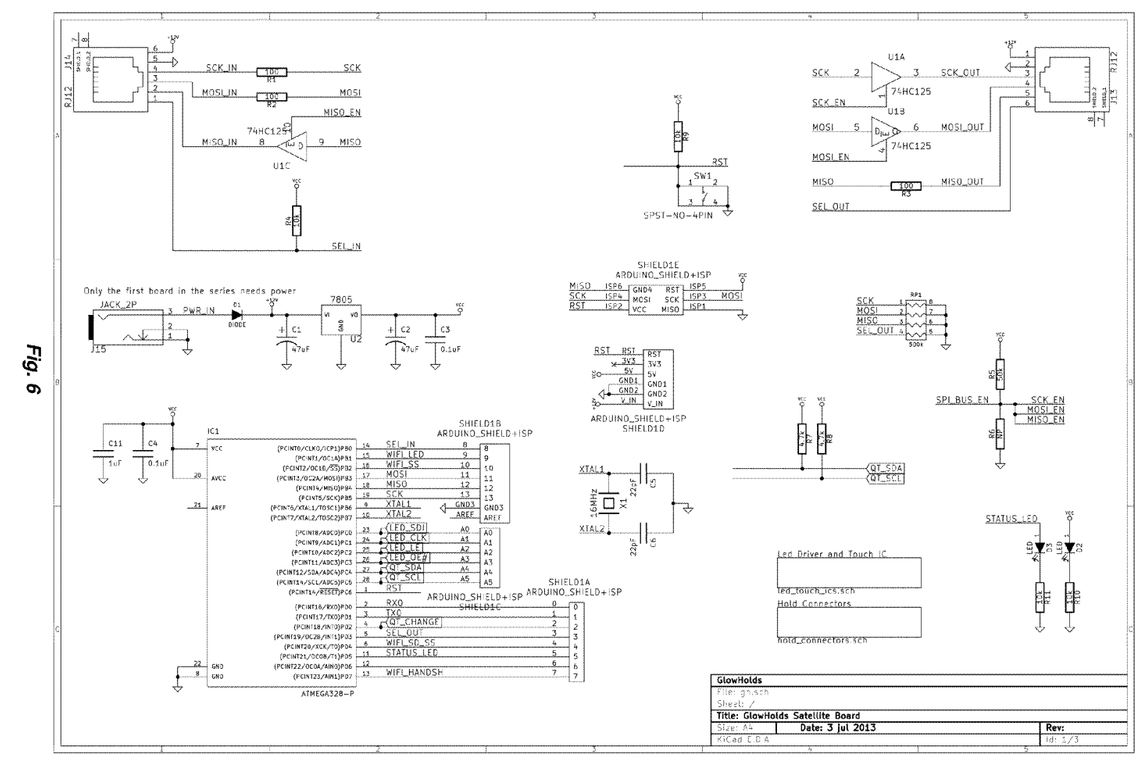
FIG. 6, 7, 8: are representative diagrams depicting circuit schematics illustrative of one embodiment of the invention.
Figure 7:
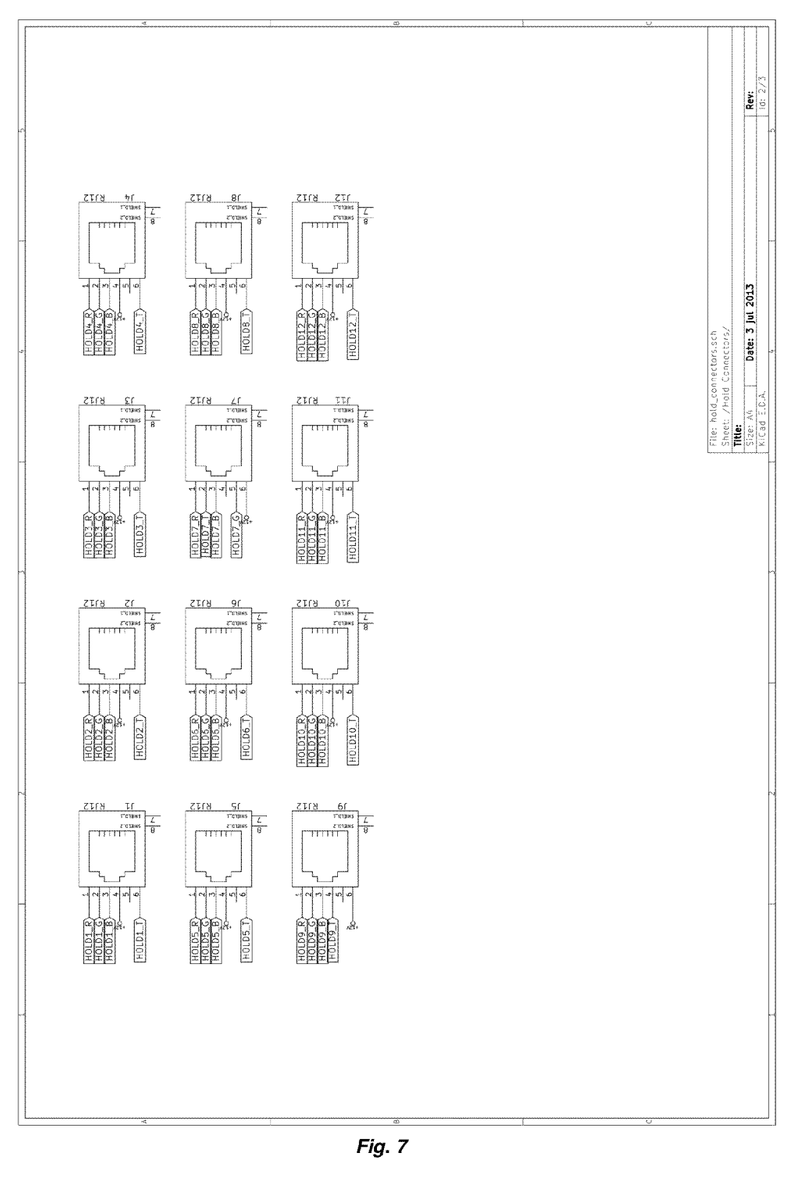
Figure 8:
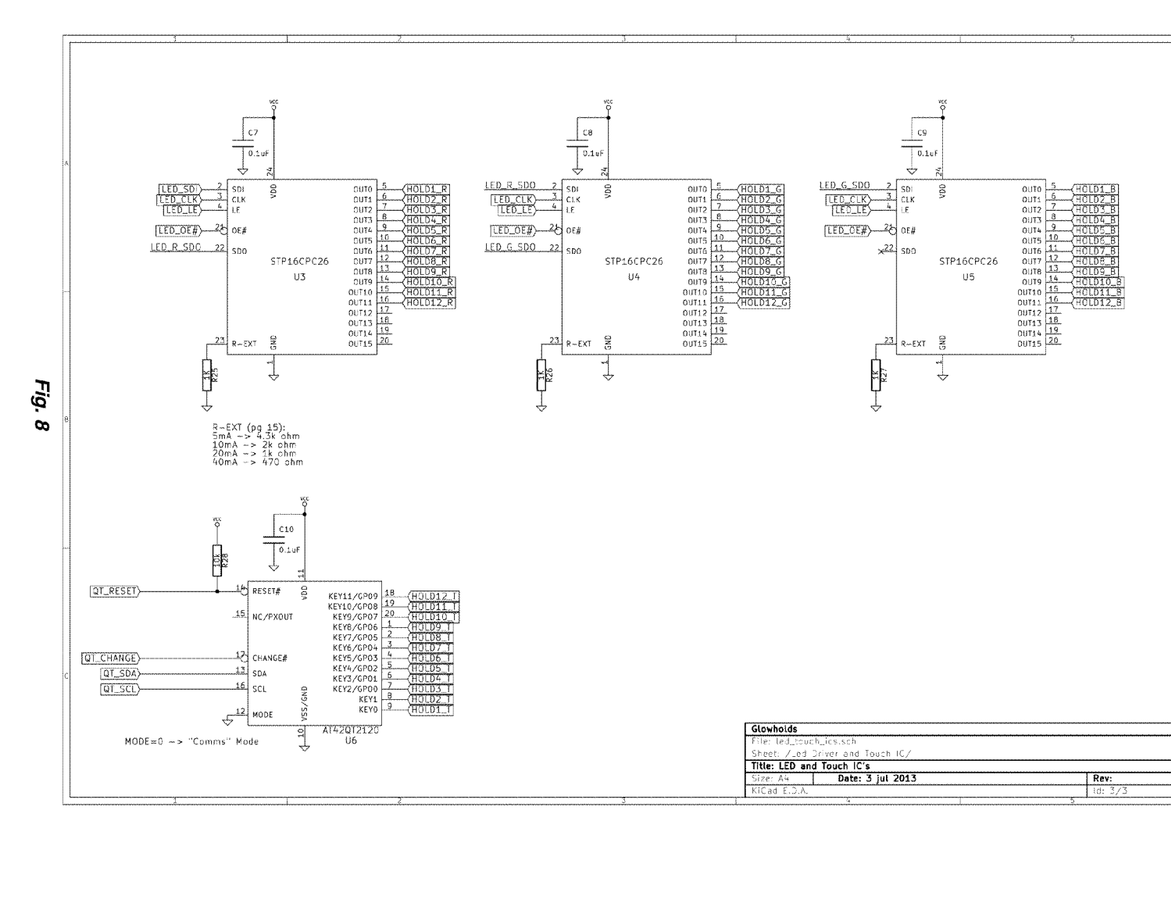

Still referring to FIG. 5, the board reflects a master/satellite design that includes RJ jacks (205) for boards to be "daisy-chained" by connecting them with a 6-wire cable. The difference between a "master" board and the satellite "slaves" is the addition of an external power supply and wireless network adapter (206) to the master. This approach provides flexible expansion by enabling the control units to support many ports for the connected light/sensor units. FIGS. 6, 7, and 8 represent an electronic schematic of one possible embodiment of the circuit board reflected in FIG. 5.

Figure 9:
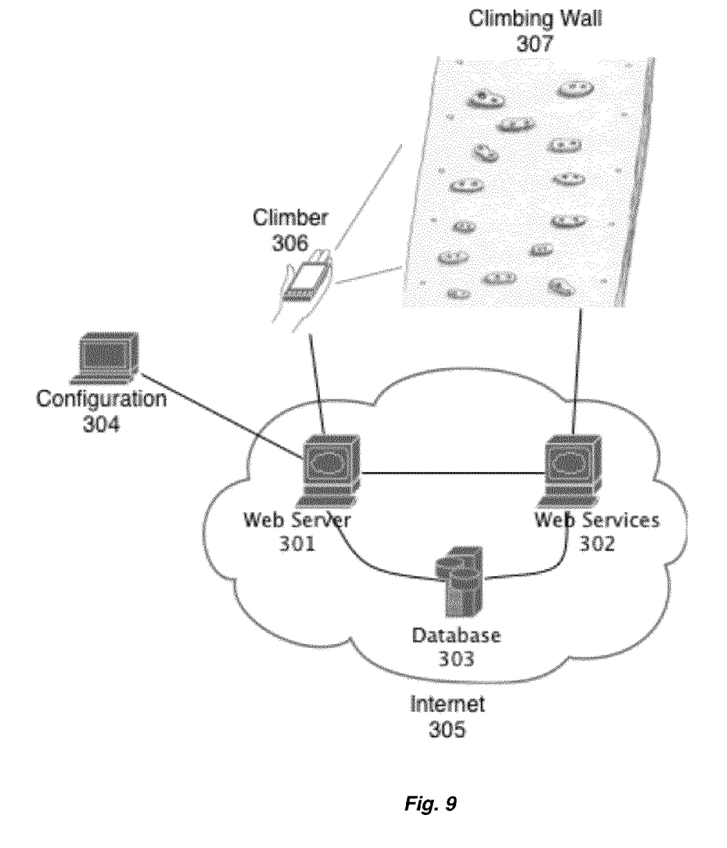
FIG. 9: diagram of the software control system.

Turning now to FIG. 9 where a diagram of the software control system is depicted. In the preferred form of the invention described above, the interaction means includes a website interface presentation means for configuration (304), a mobile interface presentation means for endusers (306), and a REST based web-service input/output means for the climbing wall control unit (307). The relational database server (303) is accessed by the web server (301) and web service server (302). The database (303) can be an authentication and authorization database. Examples of information stored in the database server include data specific to a wall location and user information, such as "Client ID" of a control unit; "role" of the user (i.e., Owner or Guest); and "Credential Information" allowing user access the internet-based service.

Figure 10:
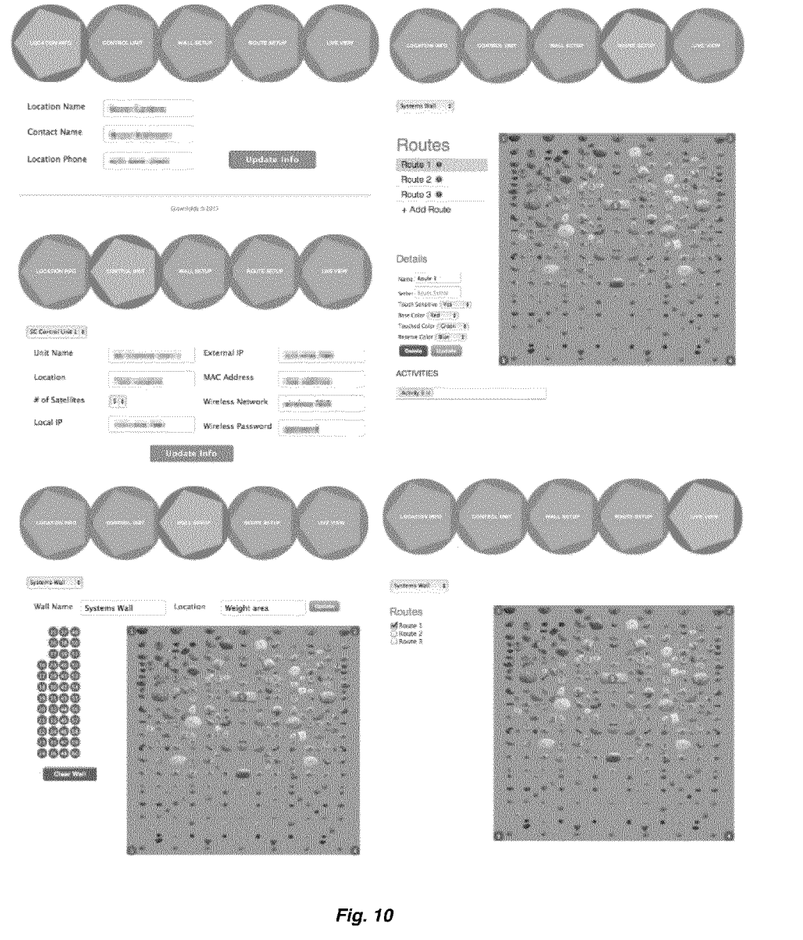
FIG. 10: screenshots from one possible embodiment of the configuration website.

Referring now to FIG. 10 where screenshots from one possible embodiment of the configuration website are depicted. In this embodiment, to simplify route and training activity setup, an interface that displays a picture of the wall will be used. Once a bolt is installed in a hold, the installer then clicks on the online image to identify it. Once the holds are defined, routes are set by clicking on a hold and selecting it's attributes. Attributes include hold color and touch sensitivity. When the setter is finished with the route, it is saved and published to the gym's library for authorized users to access via their web enabled device.

Figure 11:
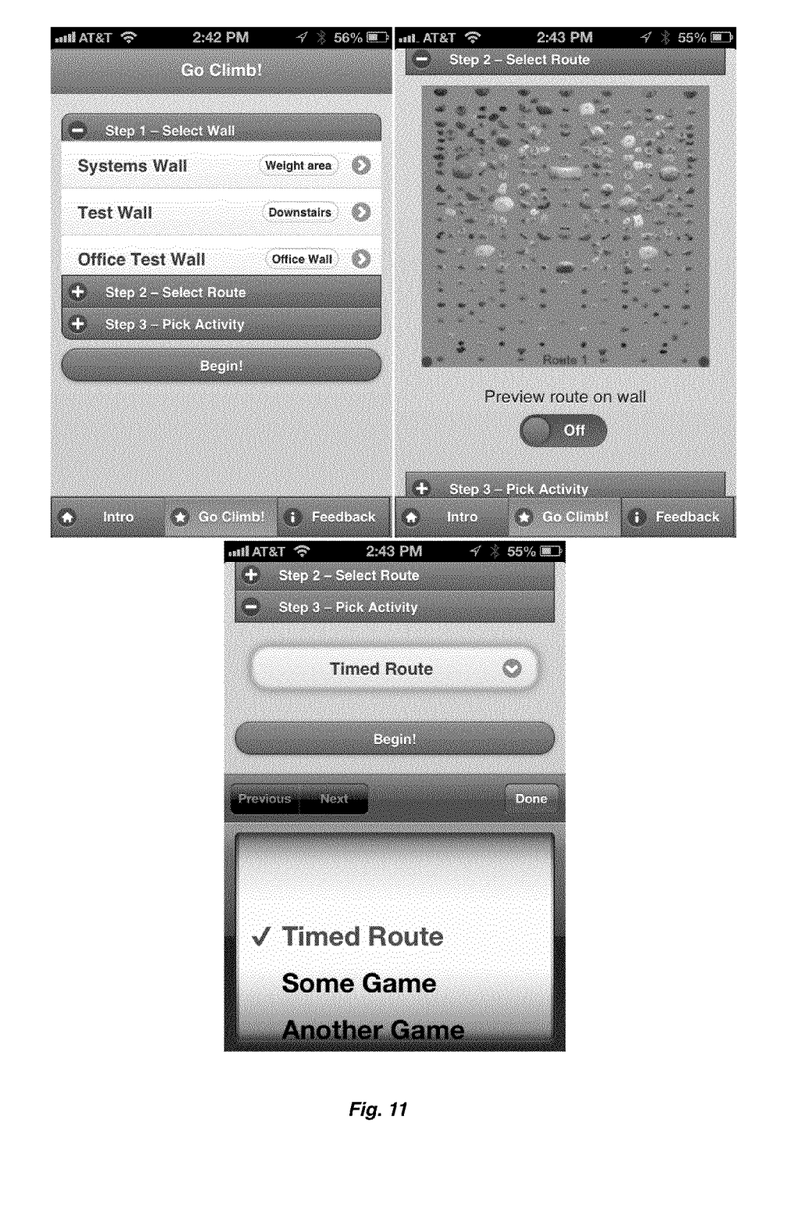
FIG. 11: a collection of screenshots of one possible embodiment of the mobile interface.

With a wall of holds, users will use their web enabled mobile device to dynamically select a route or activity that is then illuminated by the holds. Users will also have the option to set their own routes or engage in any of the training activities or games. FIG. 11 depicts a collection of screenshots of one possible embodiment of the mobile interface that climbers would use to interact with a climbing wall.

REFERENCE NUMERALS

101—Climbing hold
102—Climbing wall
103—Touch sensitive, illuminating, climbing hold bolt
105—RGB LED light source
106—Light/sensor unit
107—T-nut
108—Registered jack (RJ)
109—Fiberoptic filament
110—Translucent light diffusing material
201—Microprocessor
202—LED Display Drivers
203—Capacitive touch integrated circuit
204—Registered jack (RJ) for light/sensor unit connection
205—Registered jack (RJ) for inter-board communication
206—Wireless network adapter
206—Wireless network adapter
301—Web server
302—Web services server
303—Database server
304—Web terminal for configuration
305—Internet (WAN)
306—Mobile web enabled device for route/activity selection
307—Climbing wall with installed invention

The invention claimed is:

1. An interactive climbing wall apparatus comprising:
   a) a plurality of climbing hold mounting bolts with holes bored longitudinally through the center of said bolt to allow the transmission of light down the shaft of said bolt;
   b) a plurality of LED-sensor devices that are fastened to the posterior end of said bolt that house an RGB LED light source and convey changes in capacitance associated with a climber touching said climbing hold mounting bolt or the climbing hold the bolt is affixing to the climbing wall;
   c) a control device with network interface that is connected to said LED-sensor devices as a means for receiving and processing capacitance signals from said LED-sensor devices, and control said RGB LED light sources.

2. The apparatus of claim 1 wherein a computer communicates with said control device over a communication channel as a means to (i) illuminate a pattern of climbing holds, (ii) determine the updated climber position on said climbing wall, (iii) provide interactive feedback to the climber based on the climber's actions, (iv) enable the climber to participate in climber-selectable activities.

3. The apparatus of claim 1 wherein said control device communicates over a communication channel with at least one other control device as a means for daisy-chaining said control devices to increase the plurality of addressable LED-sensor devices.

* * * * *